United States Patent
Maliakal

(10) Patent No.: US 9,040,397 B2
(45) Date of Patent: May 26, 2015

(54) METHOD OF MAKING GRAPHENE LAYERS, AND ARTICLES MADE THEREBY

(75) Inventor: Ashok J. Maliakal, Westfield, NJ (US)

(73) Assignee: LGS INNOVATIONS LLC, Herndon, VA (US)

(*) Notice: Subject to any disclaimer, the term of this patent is extended or adjusted under 35 U.S.C. 154(b) by 735 days.

(21) Appl. No.: 13/278,344

(22) Filed: Oct. 21, 2011

(65) Prior Publication Data

US 2013/0099194 A1 Apr. 25, 2013

(51) Int. Cl.
| | |
|---|---|
| H01L 21/00 | (2006.01) |
| C01B 31/04 | (2006.01) |
| B82Y 30/00 | (2011.01) |
| B82Y 40/00 | (2011.01) |
| H01L 21/02 | (2006.01) |
| H01L 29/16 | (2006.01) |

(52) U.S. Cl.
CPC .............. *C01B 31/0446* (2013.01); *B82Y 30/00* (2013.01); *B82Y 40/00* (2013.01); *H01L 21/02422* (2013.01); *H01L 21/02527* (2013.01); *H01L 21/02623* (2013.01); *H01L 21/02664* (2013.01); *H01L 21/02667* (2013.01); *H01L 29/1606* (2013.01)

(58) Field of Classification Search
CPC .................... H01L 29/1606; H01L 29/78684; H01L 21/02628; H01L 51/0048; B82Y 30/00; B82Y 40/00
USPC ........................... 438/479, 488, 492, 497, 500
See application file for complete search history.

(56) References Cited

U.S. PATENT DOCUMENTS

| | | | |
|---|---|---|---|
| 2009/0155561 A1* | 6/2009 | Choi et al. | 428/220 |
| 2011/0033677 A1* | 2/2011 | Shin et al. | 428/201 |
| 2011/0143045 A1* | 6/2011 | Veerasamy | 427/495 |

OTHER PUBLICATIONS

Xuesong Li, et. al., "Large-Area Synthesis of High-Quality and Uniform Graphene Films on Copper Foils," Science vol. 324, 8 pages, (2009); American Association for the Advancement of Science, Washington, DC, and supporting material at www.sciencemag.org/cgi/content/full/1171245/DC1.

Zhengzong Sun, et. al., "Growth of graphene from solid carbon sources," Nature, vol. 468, pp. 549-552, Nov. 25, 2010; Macmillan Publishers Limited and Corrigendum, Nature 471, p. 124, and Supplementary Information at www.nature.com/nature/journal/v468/n7323/extref/nature09579-s1.pdf.

Abraham Ulman, "Formation and Structure of Self-Assembled Monolayers," Chemicals Reviews, 1996, vol. 96, No. 4, pp. 1533-1554; American Chemical Society.

Younan Xia, et. al., "Soft Lithography," Department of Chemistry and Chemical Biology, Harvard University, Cambridge, MA, Annu. Rev. Mater. Sci. 1998, vol. 28, pp. 153-184.

* cited by examiner

*Primary Examiner* — Zandra Smith
*Assistant Examiner* — John M Parker
(74) *Attorney, Agent, or Firm* — Baker & Hostetler LLP

(57) ABSTRACT

There is provided a method for forming a graphene layer. The method includes forming an article that comprises a carbon-containing self-assembled monolayer (SAM). A layer of nickel is deposited on the SAM. The article is heated in a reducing atmosphere and coolded. The heating and cooling steps are carried out so as to convert the SAM to a graphene layer.

10 Claims, 6 Drawing Sheets

METHOD OF MAKING GRAPHENE LAYERS, AND ARTICLES MADE THEREBY

FIELD OF THE INVENTION

The invention relates to thin film fabrication techniques, and more particularly to techniques for making thin films of carbon.

ART BACKGROUND

Graphene is a form of carbon having a hexagonal planar atomic lattice structure, as shown schematically in FIG. 1. Graphene has attracted a great deal of interest since 2004, when researchers found a simple way to produce isolated atomic planes of graphene and demonstrated a number of unique physical properties of such planes. The term "graphene" is often used in reference to atomic monolayers. Herein, however, we use the term more generally to apply to thin carbon films that have the graphene lattice structure and are thin enough, typically five or fewer atomic layers thick, that their electronic properties are dominated by the effects of reduced dimensionality and are therefore distinct from the electronic properties of bulk graphite.

Graphene is known to exhibit semiconductive or semimetallic electronic properties, as well as a direct band gap and high electron mobility. For that reason, among others, graphene is viewed as a candidate material-for transistors and integrated circuits.

Difficulties remain, however, in the production of graphene of sufficient quality and quantity, at low enough cost, to make its use in electronic devices commercially feasible.

The known techniques for making graphene films include mechanical exfoliation of graphite, epitaxial growth on suitable substrates, reduction from graphite oxide, precipitation from solutions of carbon in molten metal, and reduction of monomers such as sucrose or polymers such as polymethyl methacrylate (PMMA) on suitable substrates.

There is still a need, however, for a method of graphene synthesis that can form large films of uniform, controllable thickness at costs that are low enough to make this material industrially relevant.

SUMMARY OF THE INVENTION

I have found a new approach to producing graphene films, in which self-assembled monolayers (SAMs) are used as the carbon source for graphene synthesis. A SAM is formed when a monolayer of surfactant molecules, or other amphiphilic molecules, is adhered to a substrate surface by bonding between the substrate and a head end of each molecule. The tail ends of the amphiphilic molecules, which extend away from the substrate, align with each other to create a layer whose carbon content is determined by the chain length and other factors that depend on the particular choice of chemical species. As a consequence, the thickness of the resulting graphene film, which depends on the areal density of carbon in the source material, may be controlled by selecting the composition of the source material.

Accordingly, our approach in one embodiment comprises forming an article that comprises a carbon-containing SAM, depositing a layer of nickel on the SAM, heating the article in a reducing atmosphere, and cooling the article. (The term "cooling" is meant broadly and would include, among other techniques, purely passive cooling by simply removing the article to an environment of lower temperature, as well as reducing the ambient temperature according to a programmed schedule.) The heating and cooling steps are carried out so as to convert the SAM to a graphene layer.

In an embodiment, the article comprising a SAM is formed, at least in part, by depositing an amphiphilic compound on a substrate. The amphiphilic compound comprises a head group and a tail group, the head group comprises a moiety that adheres to the substrate, and the tail group comprises a hydrocarbon moiety.

In an embodiment, the substrate comprises silicon dioxide, the hydrocarbon moiety comprises at least one aliphatic chain, and the head group is a silyl ester functional group.

DETAILED DESCRIPTION

Figure 1:
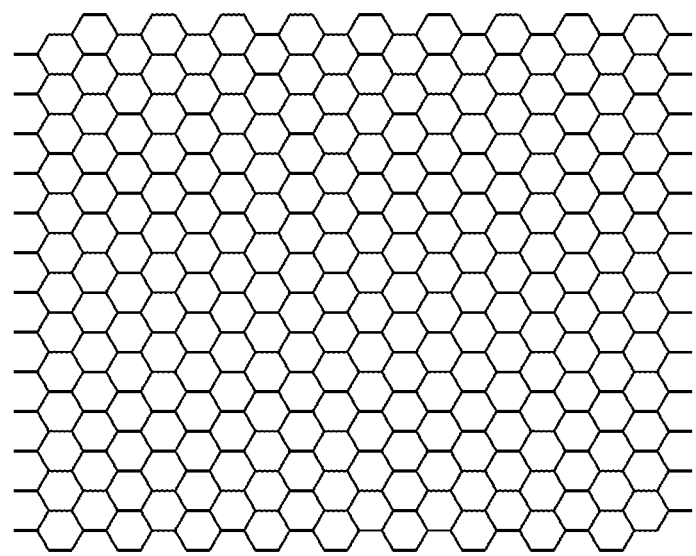
FIG. 1 is a schematic representation of the atomic arrangement in a graphene monolayer.
Figure 2:
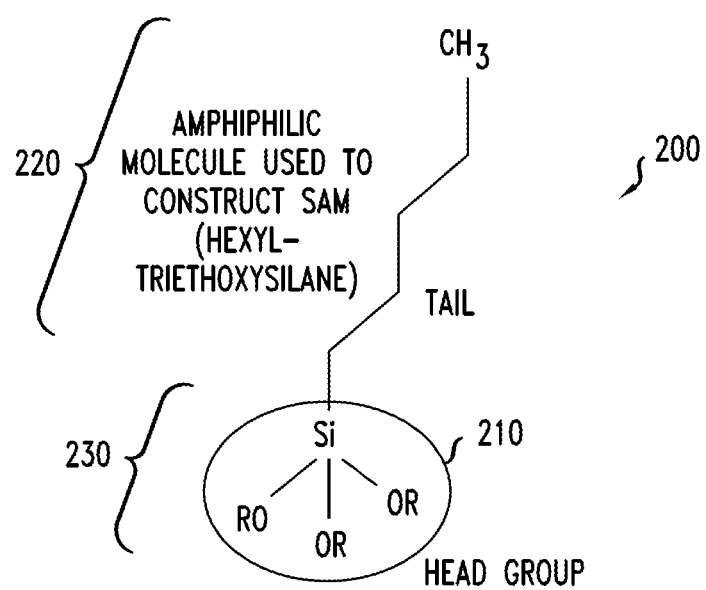
FIG. 2 is a schematic depiction of one unit of a SAM at the molecular level.

As illustrated in FIG. 2, a self assembled monolayer is an organized layer of amphiphilic molecules 200 which are oriented with respect to a substrate 210 due to a specific physical or chemical interaction with that substrate. Typical SAM molecules are surfactant molecules with a long aliphatic chain 220, which we refer to as a "tail" group, and a further portion 230, referred to hear as a "head" group, with functionality specific for surface binding. Some exemplary functional groups having the ability to bind to certain surfaces are thiol groups, carboxylic acid groups, and silyl ester groups. Silyl esters, in particular, can form covalent bonds with silicon oxide surfaces, such as silica glass surfaces. (As used herein, the terms "silica", "silicon oxide", and "silicon dioxide" are interchangeable, and should be understood broadly as encompassing all materials commonly meant by any of those names.)

Silyl esters are of particular interest for the synthesis of graphene layers because they can bond to silica glass substrates, and because they can be readily obtained or readily synthesized with any desired aliphatic chain length Cn (n denotes the number of carbon atoms) within a broad range. The range C6-C18, in particular, is of current interest for graphene synthesis. The precursor typically used to deposit silyl ester monolayers is an alkyl trichlorosilane, although trialkoxysilanes can also be used.

Accordingly, the SAM may be made of any of various amphiphilic materials, provided that such materials will adhere to the desired substrate surface. Although compounds having long aliphatic chains are currently of primary interest, aromatic compounds may also be useful in this regard.

For adhesion to silicon oxide substrates, alkyltrialkoxysilanes of Chain length C6-C18 are currently of primary interest. However, many other compounds may be useful, particularly when other substrate materials are considered. For example, SAMs on gold surfaces may be formed from alkanethiol, dialkyl disulfide, dialkyl sulfide, alkyl xanthate, and dialkylthiocarbamate compounds.

Figure 3:
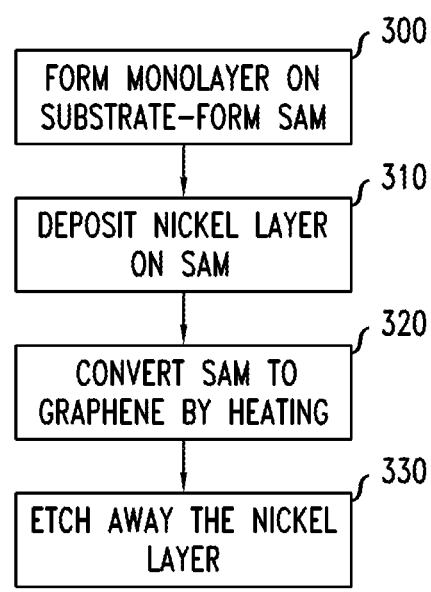
FIG. 3 is a flowchart of an illustrative process for synthesizing a graphene layer according to an embodiment of the invention.
Figure 4:
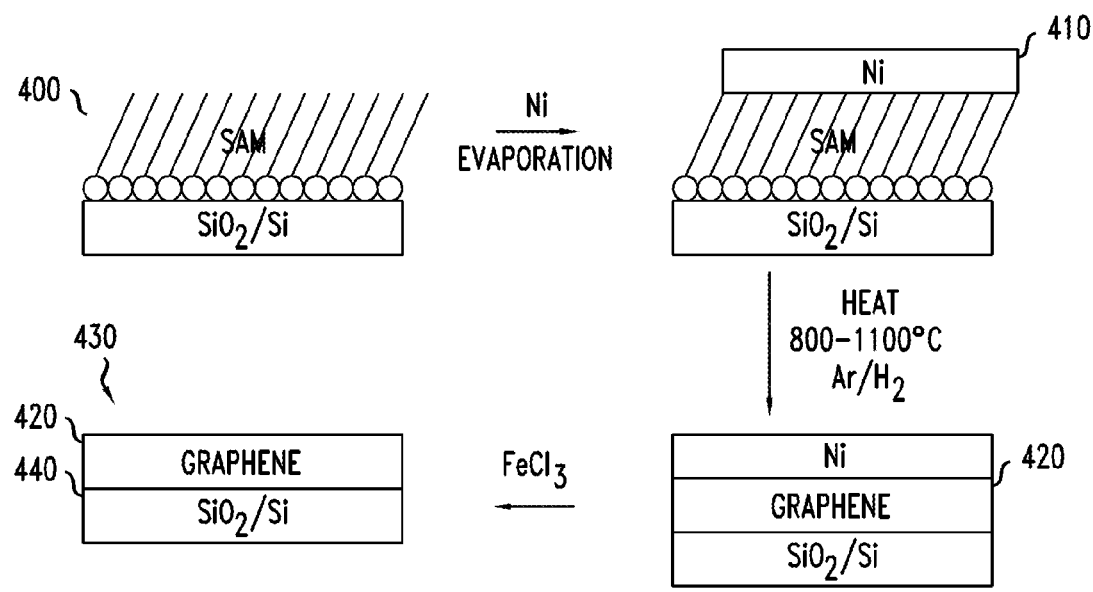
FIG. 4 is a schematic drawing illustrating progressive stages of the process of FIG. 3.

An illustrative process for synthesizing a graphene layer will now be described with reference to the flowchart of FIG. 3 and the schematic drawings of FIG. 4. Reference numerals 300-330 refer to features illustrated in FIG. 3. Reference numerals 400-440 refer to features illustrated in FIG. 4.

At 300, a monolayer of an amphiphilic compound, exemplarily an alkyl trichlorosilane of chain length C6-C18 is formed on the surface of a silica glass substrate by thermal evaporation, by microcontact printing, or by another appropriate transfer technique. The monolayer self-assembles to form a SAM.

The monolayer is deposited under conditions that assure that it is complete, and that it is ordered with respect to the substrate. In the case of alkyl trichlorosilanes, a typical procedure involves the exposure of the substrate (typically silicon dioxide on silicon) to a humid atmosphere to encourage hydration of the silicon dioxide surface. The hydrated silicon dioxide surface is then treated with the alkyltrichlorosilane by dipping of the substrate in a bath of alkyltrichlorosilane in hydrocarbon solvent (typically hexanes or toluene) and removing the substrate. Water from the hydrated silica surface permits the hydrolysis of the trichlrosilane which results in bonding of the silyl group with the silicon dioxide surface. Further hydrolysis of remaining chlorosilane functionality permits bonding between the neighboring silyl groups to create the Si—O—Si bonds. As a consequence, the resulting SAM is bonded to the silicon dioxide surface and also bonded across the film through the Si—O—Si bonds between surfactant molecules.

Numerous appropriate amphiphilic compounds have been reported in the scientific literature, together with the conditions for them to form SAMs on appropriate substrates. Reference may be usefully made, for example, to A. Ulman, "Formation and Structure of Self-Assembled Monolayers," *Chem Rev.* (1996) 1533-1554 and the references cited therein. Accordingly, appropriate conditions will be well known to those skilled in the art, and need not be discussed in detail herein.

At 310, a layer 410 of nickel, overlying the organic monolayer, is formed by thermal evaporation. Nickel is known to be a catalyst for converting organic carbon into graphene or graphite. A typical thickness for the nickel layer is in the range 50-500 nm. In an alternate procedure, the nickel may be deposited electrochemically rather than by evaporation.

At 320, the SAM is converted to graphene 420 by heating with catalysis by nickel. From earlier studies of the catalytic conversion of organic compounds, I believe that an effective temperature range for the conversion is 800-1000° C. The conversion takes place in a reducing atmosphere consisting of flowing argon and hydrogen.

In this regard, reference is usefully made to Z. Sun, et al., "Growth of graphene from solid carbon sources." *Nature* 468 (25 Nov. 2010) 549-552, and to the supplementary information thereto, which is available on-line at www.nature.com. Sun et al. reported on their growth of graphene from PMMA films spin-coated onto 25 micrometer thick copper foil. A copper substrate was selected because it was known to catalyze the formation of graphene. A typical procedure, as reported by Sun et al., was carried out in a 1-inch quartz tube furnace evacuated to 100 mTorr and maintained at a temperature of 1000° C. The coated foil was introduced into the furnace with a hydrogen flow of 50 sccm and an argon flow of 500 sccm for 10-20 minutes, while maintaining the total pressure below 30 Torr. (An "sccm" is a standard cubic centimeter per minute.) The copper foil was then removed from the hot zone of the furnace and rapidly cooled to room temperature under a hydrogen-argon atmosphere.

Sun et al. reported that the thickness of the resulting graphene layer could be controlled by controlling the gas flow rates. A bilayer was obtained at 1000° C. with an argon flow of 500 sccm and a hydrogen flow of 10 sccm. Reducing the hydrogen flow to 3-5 sccm caused greater numbers of layers to form. Increasing the hydrogen flow to 50 sccm or more resulted in the formation of monolayers only. High quality graphene monolayers were obtained at process temperatures as low as 800° C.

Sun et al. reported that they also tested nickel, among other materials, to determine whether it would be an effective substrate for growing graphene. They found that nickel is an efficient catalytic substrate.

We believe that the process conditions reported by Sun et al., particularly at the low end of their temperature range, i.e. at 800° C., Would be an effective starting point for optimizing our new process. We believe that from such a starting point, optimization could be achieved without undue experimentation.

At 330, the nickel layer is removed, exemplarily by an iron (III) chloride ($FeCl_3$) oxidative etch, leaving behind article 430, in which graphene layer 420 overlies substrate 440. Alternatively, the nickel may be removed by dissolving it in hydrofluoric acid (HF). HF may also be used to remove the underlying silicon dioxide substrate (which may itself be a layer deposited on a base member) to yield a freestanding graphene film.

It will often be desirable to provide a graphene layer that has been doped with an electron donor such as nitrogen or an electron acceptor such as boron, so that a semiconductive layer with specified properties can be formed.

In one doping technique, amphiphilic compounds suitable for SAM formation are provided, which include boron-containing or nitrogen-containing surfactant or other amphiphile molecules. Many compounds which will readily form appropriate substituents in, e.g., aliphatic hydrocarbon chains are known. Examples include borate esters, boronic acids, and amines. The doping concentration in the resultant graphene layer may be controlled by to controlling the relative amount of alkyl surfactant and nitrogen-containing or boron-containing surfactant in the SAM layer.

Upon conversion of the SAM to graphene, I believe that an effective fraction of the dopant atoms will be incorporated in the graphene lattice in substitution for lattice carbon atoms. Support is found, for example, in Z. Sun et al., cited above, which reports successful nitrogen doping of graphene films converted from PMMA by adding melamine (1,3,5-triazine-2,4,6-triamine) to the spin-deposited PMMA solution. As reported there, the doped graphene film was grown by heating in a tube furnace at 1000° C. for 10 minutes at one atmosphere pressure, with 100 sccm hydrogen flow and 500 sccm argon flow. The higher pressure was believed necessary in order to maintain the nitrogen-atom concentration. X-ray photoemission spectroscopy confirmed that nitrogen atoms were incorporated in the graphene lattice.

Patterning of the dopant in the resulting graphene layer is highly desirable. The SAM can be formed with a pattern that includes areas which are without dopant atoms and other areas which include dopant-containing compounds at various concentrations. These areas can be defined by various patterning techniques e.g., microcontact printing.

For p-type doping, for example, a conventional surfactant used to form monolayers is mixed with a desired concentration of a further surfactant whose molecular formula includes boron (or aluminum), and for n-type doping, the conventional surfactant is mixed with a nitrogen-containing surfactant (alternatively, a phosphorus-containing surfactant). The surfactant mixture is provided as a microcontact printing ink which wets a silicone elastomeric stamp, after which it is transferred from the stamp to selected domains on the substrate surface. The inked domains are bound to the substrate surface by hydrolysis.

By way of illustration, one possible ink that may be used for p-type doping is a mixture of tris(trimethylsilyl) borate and alkyl trichlorosilane. One possible ink that may be used for n-type doping is a mixture of aminohexyl triethoxysilane and alkyl trichlorosilane.

Figure 5:
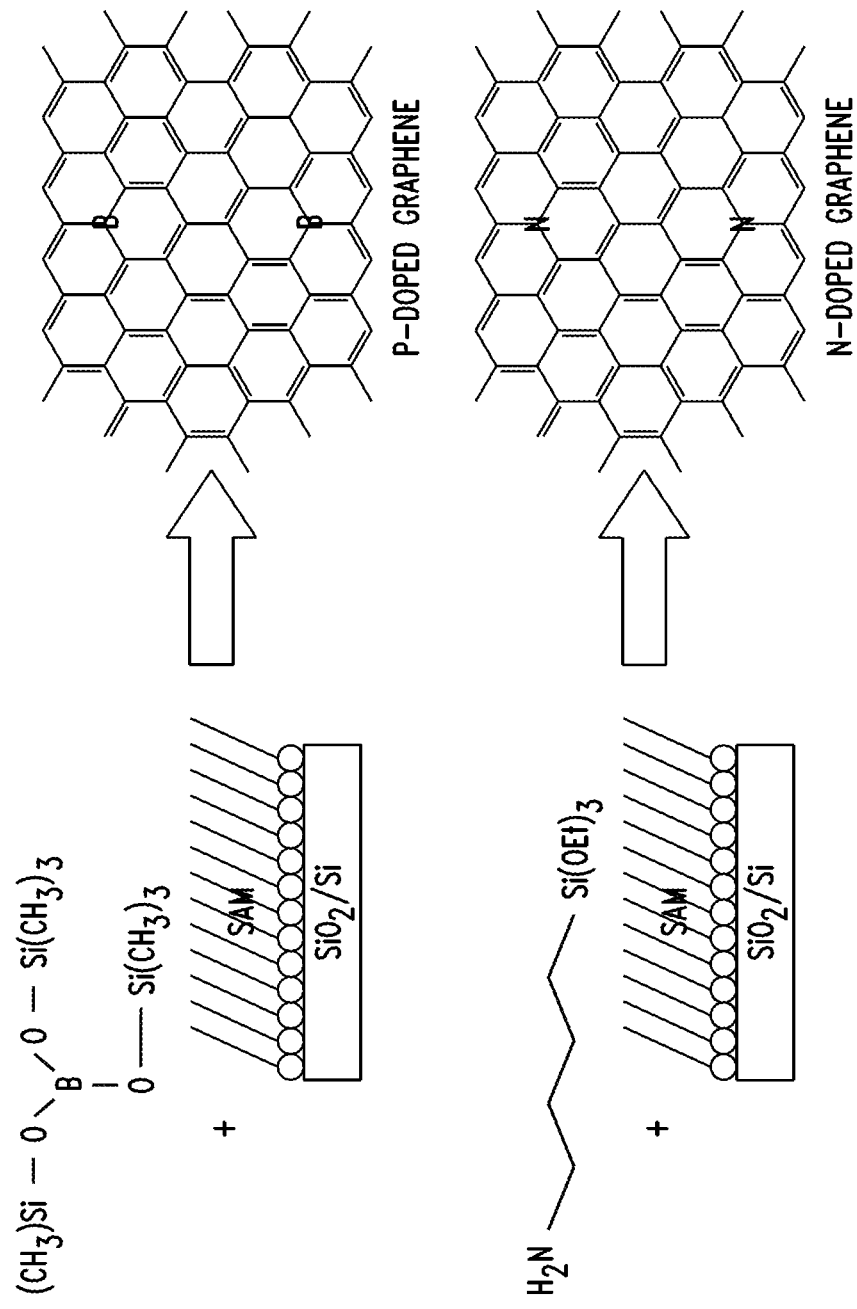
FIG. 5 is a schematic drawing illustrating the doping of a graphene layer.

When the SAM is subsequently converted to graphene, at least some of the boron atoms from the p-type ink or nitrogen atoms from the n-type ink become incorporated in the graphene lattice in substitution for carbon. This is illustrated in FIG. 5, where "B" indicates a boron atom incorporated in the lattice for p-type doping, and "N" indicates a similarly incorporated nitrogen atom for n-type doping.

In some cases it will be desirable to pattern the doped graphene layers, for example by providing dopant concentration gradients having specified profiles, or by forming semiconductor junctions by adjoining p-doped features to intrinsic or n-doped features, or similarly by adjoining n-doped features to intrinsic features. The formation of semiconductor junctions and dopant gradients would be useful, for example, for making diodes, field-effect transistors, and other electronic devices.

Figure 6:
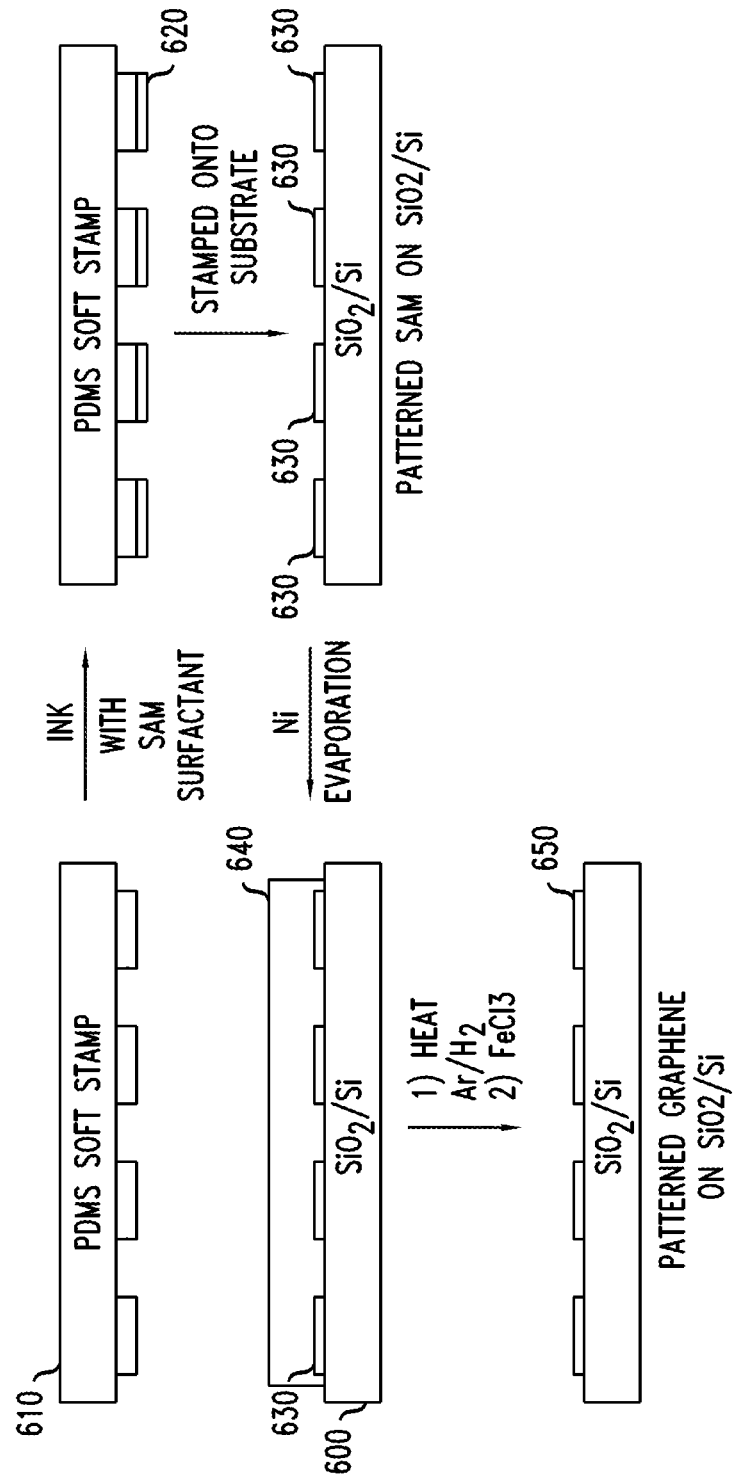
FIG. 6 is a schematic drawing illustrating progressive stages of a process for forming a patterned graphene layer.

Patterned SAMs may be provided by any of various known techniques, not least of which is microcontact printing as illustrated, e.g., in FIG. 6. Applications of microcontact printing for the patterning of SAMs are described, for example, in Y. Xia et al., "Soft Lithography," *Amer. Rev. Mater. Sci.* 28 (1998) 153-184, and references cited therein.

Accordingly, a patterned SAM having a first type of doping provided as described above may be deposited on substrate 600 in a first transfer step by microcontact printing using patterned stamp 610 to transfer ink 620 to the substrate. The first transfer step is spatially selective, so that some domains 630 on the substrate surface will be coated, and other domains will remain bare. Then, in one or more further transfer steps, patterned SAM layers having different dopant types or different dopant levels may be deposited on selected parts of the bare domains.

The further transfer steps may be performed using microcontact printing. However, portions to which SAMs have already been bound will reject further applications of the amphiphilic compounds that are SAM precursors. Accordingly, the SAMs that have already been formed may inherently form a mask for aligning the next transfer step. In such a case, the next application of the amphiphilic precursor compound may be made in a spatially non-selective way, e.g. by dipping or by vapor exposure.

After the complete layer of patterned SAM domains has been formed, conversion to graphene is performed as described above.

As explained above, the growth of graphene 650 is catalyzed by a layer 640 of nickel that is deposited over the SAM. The layer of nickel may also be patterned, e.g. by deposition through a mask or by lithographic etching. During the subsequent heat treatment, only those SAM portions that lie beneath the patterned nickel layer will be converted to graphene. This provides a further method for patterning the graphene layer.

What is claimed is:

1. A method, comprising:
   forming an article that comprises a carbon-containing self-assembled monolayer (SAM);
   depositing a layer of nickel on the SAM;
   heating the article in a reducing atmosphere; and
   cooling the article, wherein
   the heating and cooling steps are carried out so as to convert the SAM to a graphene layer,
   the forming step comprises depositing at least one amphiphilic compound on a substrate including silicon dioxide,
   the amphiphilic compound comprises a tail group and a head group,
   the tail group comprises a hydrocarbon moiety including at least one aliphatic chain, and
   the head group comprises at least one species which is a thiol, a disulfide, a xanthate, a thiocarbamate, a carboxylic acid, a silyl ester, or a phosphonate, and the head group comprises a moiety that adheres to the substrate.

2. The method of claim 1, wherein the head group adheres to the substrate by covalent bonding.

3. The method of claim 1, further comprising removing the substrate from the graphene layer.

4. The method of claim 1, wherein the nickel is deposited by thermal evaporation.

5. The method of claim 1, further comprising removing the nickel layer.

6. A method, comprising:
   forming an article that comprises a carbon-containing self-assembled monolayer (SAM);
   depositing a layer of nickel on the SAM;
   heating the article in a reducing atmosphere; and
   cooling the article, wherein
   the heating and cooling steps are carried out so as to convert the SAM to a graphene layer,
   the forming step comprises depositing a mixture of at least two amphiphilic compounds on a substrate,
   the amphiphilic compound comprises a tail group and a head group,
   the head group comprises a moiety that adheres to the substrate,
   the tail group comprises a hydrocarbon moiety,
   at least one of said amphiphilic compounds is an alkyl surfactant, and
   at least one of said amphiphilic compounds comprises a p-type or n-type dopant element selected so that the heating and cooling steps result in the formation of a graphene layer having, respectively, p-type or n-type semiconductive behavior.

7. The method of claim 6, wherein the head group adheres to the substrate by covalent bonding.

8. The method of claim 6, further comprising removing the substrate from the graphene layer.

9. The method of claim 6, wherein the nickel is deposited by thermal evaporation.

10. The method of claim 6, further comprising removing the nickel layer.

* * * * *